Oct. 31, 1967 G. H. BLAESER 3,350,649
FREQUENCY CONVERTER UTILIZING A TUNNEL DIODE AND A MICROSTRIP LINE
Filed Jan. 29, 1964 2 Sheets-Sheet 1

INVENTOR.
GUSTAV H. BLAESER
BY Wade Koontz
George Fine
ATTORNEYS

INVENTOR.
GUSTAV H. BLAESER
BY Wade Koontz
and George Fine
ATTORNEYS 3,350,649

FREQUENCY CONVERTER UTILIZING A TUNNEL DIODE AND A MICROSTRIP LINE

Gustav H. Blaeser, Framingham, Mass., assignor to the United States of America as represented by the Secretary of the Air Force Filed Jan. 29, 1964, Ser. No. 341,143
2 Claims. (Cl. 325—449)

ABSTRACT OF THE DISCLOSURE

Apparatus for down conversion of microwave frequency having a waveguide with a conducting and pump frequency source at one opening and a plunger at the other opening. A microstrip line is coupled to the waveguide with a probe and a tunnel diode is biased with a positive voltage and inserted one-half wavelength from an adjustable short circuit for varying the conductance of the microstrip line.

The invention described herein may be manufactured and used by or for the United States Government for governmental purposes without payment to me of any royalty thereon.

This invention relates to apparatus for converting electromagnetic energy to a lower frequency and, more particularly, to apparatus utilizing tunnel diodes in combination with a variable microstrip line.

It is known that the utilization of high generator conductances in tunnel diode down converters will give rise to desirable low noise factors.

This invention offers a noise reduction of 3 to 4 db for down conversion of microwave frequencies and higher to VHF by using high generator conductances in the order of 1 to 10 mhos and a low noise factor on the average of 4 db for microwave frequency to VHF. It is obtained by using a pill package microwave tunnel diode in a microstrip line and having a convenient adjustment of the high generator conductances. This invention has the advantage of a reduction in size for microwave down converters as well as high mechanical, electrical, and thermal stability, and a protection against dirt, moisture, and vibration.

As long as the signal frequency is low (UHF to X-band) a conductance transformation from conventional microwave equipment with 0.02 mho to 1 mho is possible by using tuned circuitry. But signal frequencies from X-band to higher frequencies call for a different useful solution because in this range waveguide systems and waveguide circuitry have to be used and generator conductances higher than 1 mho are desirable. Double stub tuners could accomplish a conductance transformation of low range, but the space demand and the disadvantage of additional series impedance to modern pill package microwave tunnel diodes created by holding-pins in the interior of a waveguide system also calls for a more practical solution.

Generator conductances from 1 to 10 mhos can be used in a microwave down converter to obtain a reduction of noise. This invention uses a pill package microwave tunnel diode with high generator conductances to convert microwave frequencies and higher to VHF. The noise reduction is in the order of 3 to 4 db compared with results of a balanced down converter in conventional waveguide systems operated with standard microwave diodes. Measured noise figures of a tunnel diode down converter, incorporating this invention, with X-band signal and VHF output frequency were 4 db on the average.

This invention is a microwave down converter with pill package microwave tunnel diode. In a down converter configuration for microwave frequencies, the invention consists of a conventional waveguide, a conducting signal and pump frequency source, a plunger, and a probe coupled microstrip line in which the tunnel diode is inserted and biased with positive voltage in the known way near the peak at the positive conductance side in the I–V characteristic. The tunnel diode is completely imbedded in a dielectric layer, consisting for instance, of Plexiglas which fills the short circuited resonant microstrip line. The tunnel diode is located at a distance $l=\frac{1}{2}\lambda$ from the short circuit and one terminal of the tunnel diode is in direct contact with a conductor. The dielectric has the same height as the tunnel diode to avoid any additional series inductance at the $\frac{1}{2}\lambda$ point and close to this point prevail high conductances which can be considered as generator conductances for matched or mismatched conditions of the tunnel diode, transformed from low values of the nonresonant waveguide to high values at the working point of the microstrip line. To meet the requirement and to have the possibility of an adjustment of a value of high generator conductance, the length between the tunnel diode and the short circuit has been made adjustable by means of a variable short circuit. By varying the length $l$, the $\frac{1}{2}\lambda$ point will be shifted away from the tunnel diode so that a smaller value of conductance exists at the tunnel diode. The whole possible length of the microstrip line consists of two sections, section 1 and section 2, of different characteristic impedances with the last having a smaller impedance than the first. Small values of the characteristic impedance of section 2 are desirable in order to transform the conductance at $l=\frac{1}{2}\lambda$ in this $\frac{3}{4}\lambda$ long section up to a higher value than required for the mismatching condition of the tunnel diode. In an experimental device, the impedance of the section 2 was 16 ohms and the highest conductance at $l=\frac{1}{2}\lambda$ was 27 mhos. The other section of the microstrip line can be designed to a suitable length of several $\frac{1}{2}\lambda$. A multiple number of sections with different characteristic impedances is possible. The conductor of the microstrip line in contact with the tunnel diode is coupled by a probe which is inserted into a waveguide at a suitable place. A ground plate is in firm metallic connection with the waveguide.

The size of the microstrip line down converter, for instance, for X-band frequencies is another advantage. The dimensions of an experimental device for this frequency range were 5½ by 2 by ¼ inches which compare favorably with those of commercial balanced mixers using conventional crystal diodes.

The thermo and electrical stability is excellent because all parts of the down converter are built from material with high stability and ruggedness. As further advantage, on the contrary to open waveguide circuitry, the press-fit dielectric, as well as the short circuit, hold the conductor and the ground plate of the microstrip line together in a rigid assembly and keep dirt and moisture from entering the line and the environment of the pill package microwave tunnel diode. In this way, the diode is also protected against the effects of vibration.

It is, therefore, an object of my invention to provide a system of down conversion of microwave frequency while obtaining a noise factor reduction compared with standard systems.

A further object of this invention is to provide a system for convenient adjustment of high generator conductances.

These and other objects and features of this invention will become more apparent by reference to the following description when taken in conjunction with accompanying drawings in which.

Figures 1, 2:
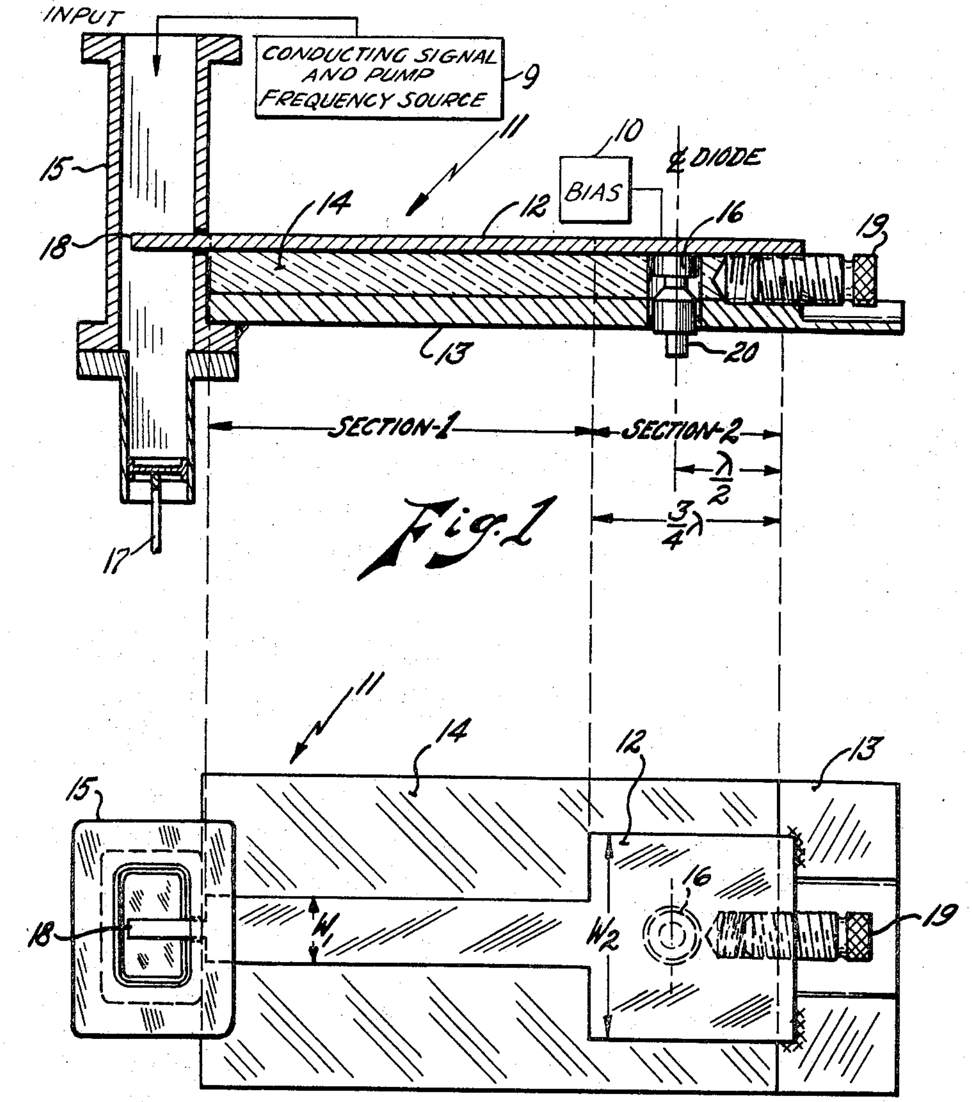
FIG. 1 shows a front view in elevation of the microwave down converter with pill package microwave tunnel diode.
FIG. 2 shows a plan view of the microwave down converter.

FIG. 1 shows the lossy microstrip line 11 which comprises conducting plate 12, ground plate 13, and a dielectric 14 which can be Plexiglas. The high frequency signal is injected into waveguide 15 which has waveguide plunger 17 at one end by conducting signal and pump frequency source 9. Microwave tunnel diode 16 is embedded in the dielectric at a distance $l=\frac{1}{2}\lambda$ with one end in contact conducting plate 12 and biased by bias source 10. Microstrip line 11 is coupled to waveguide 15 by probe 18. A variable short circuit is obtained by use of adjustment screw 19 which could also be a micrometer screw or pin. Adjusting screw 19 is in contact with conducting plate 12 and ground plate 13. The output is taken from adapter 20.

Referring to FIG. 20, the whole possible length of the microstrip line consists of two sections, section 1 and section 2 each having a different characteristic impedance, the last being smaller than the first. Each section has a different width $W_1$ and $W_2$.

Figure 3:
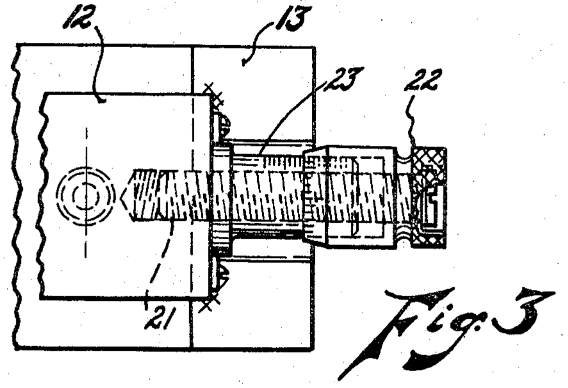
FIG. 3 shows an alternate embodiment of the variable short circuit.

FIG. 3 shows the variable short circuit in the form of a micrometer screw. Microscrew 21 is in adjustable contact with conducting plate 12 and ground plate 13. Accurate adjustments can be made by turning microknob 22. Indicator markings are on indicator nut 23.

Figure 4:
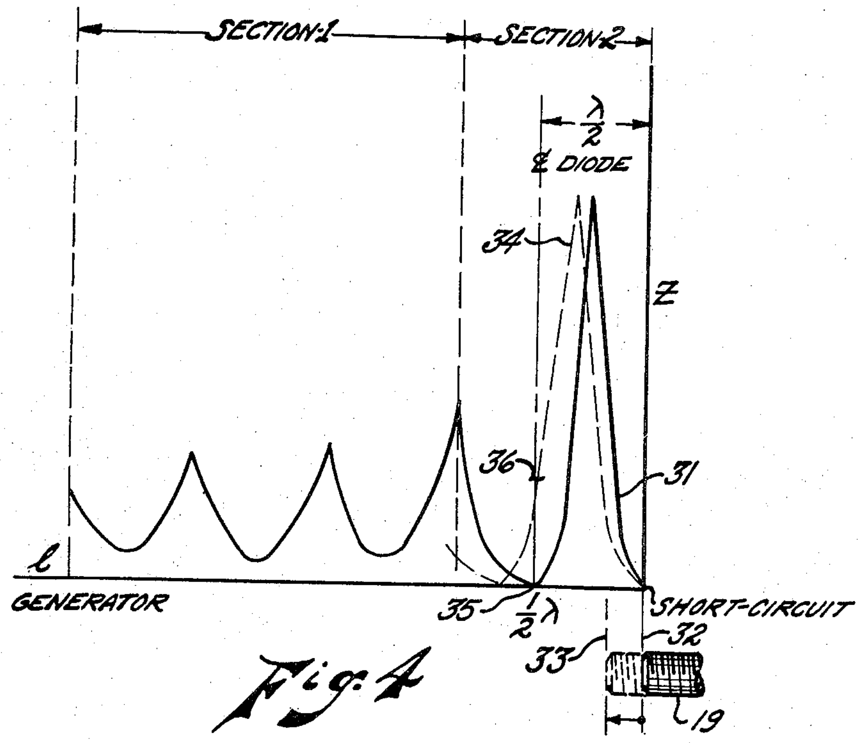
FIG. 4 shows a typical impedance distribution of the microstrip line.

A typical impedance distribution of the microstrip line is shown in the graph of FIG. 4. Solid line 31 shows the impedance distribution before the short circuit is altered by screw 19. When the short circuit is moved from position 32 to position 33, the impedance distribution is then shown by dotted line 34. The microwave tunnel diode is located at $l=\frac{1}{2}\lambda$ shown at position 35 where the impedance is a minimum when the short circuit is in the original position. In the altered position 33 has changed as shown at 36.

Figure 5:
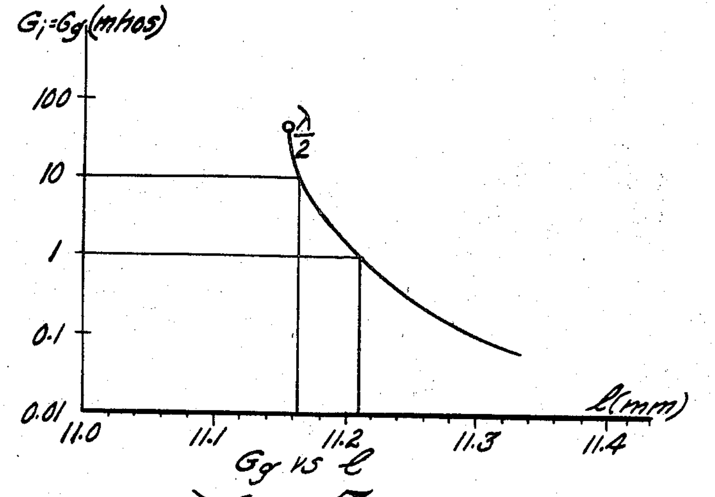
FIG. 5 is a plot of the conductance of the microstrip line.

In FIG. 5 is plotted, for section 2 as an example, the microstrip line conductance $G_l$ from the point $l=\frac{1}{2}\lambda$ toward $\frac{3}{4}\lambda$. In this example, the characteristic impedance of the second section is equal to 16 ohms, the dielectric is Plexiglas with an $\epsilon$ of 2.6, the height of the dielectric is $\frac{1}{16}$ inch and the attentuation constant $\alpha$ is .207 neper per meter for a frequency of 8 kmc. The input admittance is $Y_1=G_1\pm jB_1$. The input conductance $G_l$ is equal to the generator conductance $G_g$ and when the length $l$ is changed, for example, from $\lambda=11.21$ mm. to 11.675 mm., the generator conductance will change from 1 mho to 10 mhos respectively. By means of a rotatable short circuit in an experimental microwave tunnel diode converter for a signal frequency of 8.3 kmc. and an output of 30 mc., it was possible to adjust for a generator conductance of 2 mhos, for which the noise factor was measured on the average of 4 db.

What is claimed is:

1. An apparatus for converting a high frequency to a lower frequency, utilizing a high generator conductance, comprising: a waveguide having a first opening and a second opening; means for injecting a conducting signal and a pump frequency signal in said waveguide at said first opening; a plunger mounted on said waveguide at said second opening; a microstrip line having a probe coupled to said waveguide at one end and a short circuit at the opposite end, said microstrip line comprising, a conductor in contact with said probe, a ground plate having a metallic connection to said waveguide, a dielectric layer interposed between said conductor and said ground plate; means for adjusting the conductance of said microstrip line by positioning said short circuit; a tunnel diode inserted in said microstrip line one-half wavelength of the output signal from said short circuit, having one terminal in direct contact with said conductor; means for biasing said tunnel diode; and an adapter mounted on said tunnel diode for utilization of the output frequency.

2. A low noise factor mixer for down conversion of microwave frequencies comprising: a signal source; a pump frequency source; a microstrip line; means for feeding simultaneously said signal source and said pump frequency source into said microstrip line; a microwave tunnel diode embedded at a predetermined position in said microstrip line; means for biasing said tunnel diode; and a variable short circuit located at one end of said microstrip line for adjusting the conductance thereof.

References Cited

UNITED STATES PATENTS

| | | | |
|---|---|---|---|
| 3,125,725 | 3/1964 | Chang | 325—449 |
| 3,131,353 | 4/1964 | Kim | 325—449 |
| 3,166,713 | 1/1965 | Chang et al. | 325—449 |
| 3,179,892 | 4/1965 | Chadsek | 325—449 |
| 3,196,356 | 7/1965 | Hines | 325—449 X |

KATHLEEN H. CLAFFY, *Primary Examiner.*

R. S. BELL, *Assistant Examiner.*